United States Patent [19]

Miwada

[11] Patent Number: 4,554,675
[45] Date of Patent: Nov. 19, 1985

[54] CHARGE TRANSFER DEVICE OPERATIVE AT HIGH SPEED

[75] Inventor: Kazuo Miwada, Tokyo, Japan

[73] Assignee: Nippon Electric Co., Ltd., Tokyo, Japan

[21] Appl. No.: 450,177

[22] Filed: Dec. 16, 1982

[30] Foreign Application Priority Data

Dec. 16, 1981 [JP] Japan .................. 56-202850

[51] Int. Cl.[4] .................. G11C 19/28; H01L 29/78
[52] U.S. Cl. ........................... 377/60; 377/63; 357/24
[58] Field of Search .............. 377/57, 58, 60, 62, 377/63, 61; 357/24; 307/269

[56] References Cited

U.S. PATENT DOCUMENTS 3,758,794 9/1973 Kosonocky .............. 377/63 X
3,955,100 5/1976 Takahashi et al. ........ 377/63 X
4,093,872 6/1978 Hartman ................... 377/60 X
4,178,519 12/1979 Engeler et al. ............ 377/60
4,264,915 4/1981 Bierhenke et al. ........ 377/60 X

FOREIGN PATENT DOCUMENTS 5394 2/1973 Japan .................. 377/63

OTHER PUBLICATIONS

Anantha et al., "Charge Sensing Circuit Using Charge Amplification"; IBM Tech. Discl. Bull.; vol. 18, No. 12, pp. 4019–4020; 5/1976.

Primary Examiner—Larry N. Anagnos
Attorney, Agent, or Firm—Sughrue, Mion, Zinn, Macpeak & Seas

[57] ABSTRACT

A charge transfer device having a plurality of transfer gates to which phased clock pulses are provided to transfer charge serially from semiconductor regions underlying the transfer gates through an output region underlying an output gate to a charge detector region. The last transfer gate preceding the output gate is fed with a phased clock pulse via a signal line other than the signal lines feeding the remaining transfer gates. The former signal line has an RO time constant lower than that for the other signal lines and permits rapid charge transfer from the last stage to the charge detecting device.

12 Claims, 11 Drawing Figures (a)   (b)

(PRIOR ART)

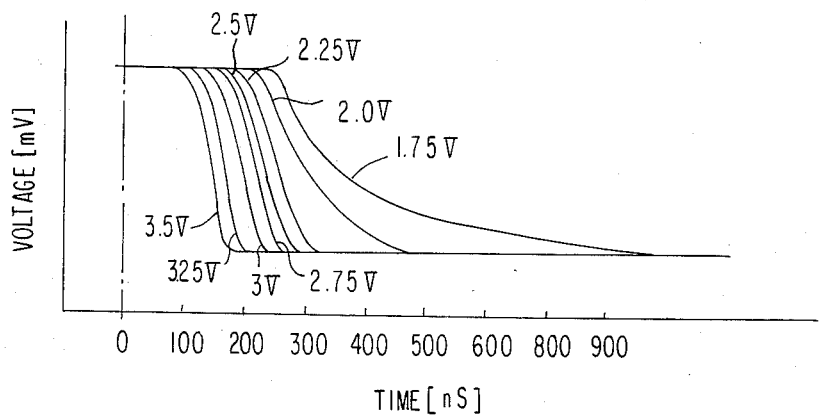
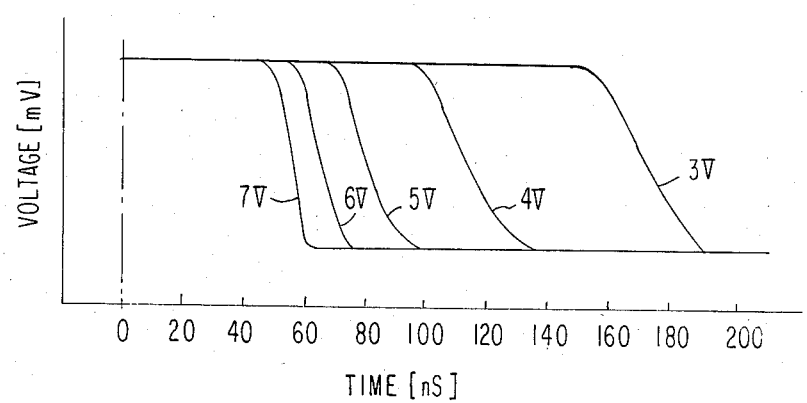
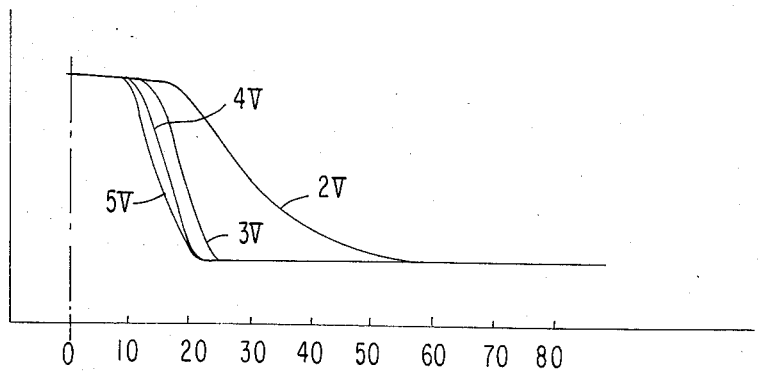
FIG. 7

CHARGE TRANSFER DEVICE OPERATIVE AT HIGH SPEED

BACKGROUND OF THE INVENTION

This invention relates to a charge transfer device and more particularly, to the structure for applying clock pulses (transfer control signals) to the charge transfer gates.

A conventional charge transfer device includes a large number of charge transfer gate elements arranged in series and is so constructed that the transfer gate elements sequentially transfer a charge in response to a plurality of clock signals having different phases. The charge transfer process of a device of this kind is described in detail on pages 8 to 14, W. S. Boyle and G. E. Smith in "The Bell System Technical Journal", April, 1970.

A conventional charge transfer gate device is constructed in such a manner that one of the charge transfer clock pulses is applied in common to a plurality of transfer gate elements which are not adjacent to each other. In the actual structure, a single signal line for applying a one-phase clock pulse is wired on a chip so as to be in multiple contact with the plurality of transfer gate elements. Accordingly, a distortion of the clock pulse occurs due to the wiring capacitance of this clock signal line, the capacitances of the transfer gate elements and a resistor which is provided to prevent the electrostatic breakdown of the transfer gate elements. This distortion adversely affects charge detection and charge transfer speed. That is, the charge detection is executed, before all of transferred charge is supplied to the charge detection element because of the distortion of the clock pulse applied to the final transfer gate. As a result, correct charge detection can not be obtained.

On the other hand, this shortcoming can be avoided by detection over a long period of time. However, the long detection period results in a decrease in device operating speed.

In actual operation, a distorted clock pulse applied to the transfer gate element of the final stage shows the change of the potential well under the gate. As a result, the transfer of charge to the detection element through the output gate (which is normally fixed at a predetermined potential) is delayed and hence, the charge detection element must be controlled to allow for this delay. This makes it impossible to obtain high speed operation of the device. Furthermore, the charge transferred via the transfer gate element of the final stage must be held for a predetermined period of time in the detection element for accurate detection of the transferred charge. To satisfy this object, the detection element is constructed so that a predetermined holding time can be set. The holding time is a period from the time when all of the transferred charge is stored in the detection element to the time when a reset pulse is applied to the detection element. However, this holding time of the prior art device must be set to a longer period in consideration of the delay, because the transfer of the charge from the transfer gate element of the final stage is delayed by the distortion of the clock pulse. If the clock pulse is a 5 MHz signal, for example, a reset signal with a maximum value of only approximately 5 MHz can be applied to the charge detection element of a conventional charge transfer device. In other words, since the operating speed of the device is determined by the control speed of the charge detection element, high speed operation cannot be obtained from the conventional device for the reasons described above.

SUMMARY OF THE INVENTION

It is therefore an object of the present invention to provide a charge transfer device having an improved operating speed.

It is another object of the present invention to provide a charge transfer device in which a correct charge detection can be executed.

It is still another object of the present invention to provide a charge transfer device which can apply a clock pulse having less distortion to the transfer gate element of at least the final stage of the device.

It is still another object of the present invention to provide a charge transfer device in which the charge holding time in the charge detection element is substantially increased so as to prevent errors in the detection of the quantity of charge.

It is still another object of the present invention to provide a charge transfer device which makes it possible to increase the maximum driving frequency of the device without reducing the electrostatic proof voltage of the transfer gate elements.

In accordance with the present invention, a charge transfer device has a structure in which a supply means supplying clock pulses to the final transfer gate element immediately before the output stage gate is separated from a supply means supplying the same clock pulses to the other transfer gate elements.

In accordance with the present invention there is provided a charge transfer device of the type comprising electrodes of transfer gates and an output gate on the surface of a semiconductor substrate via an insulation film and a region having the opposite conductivity to that of the semiconductor substrate provided in the semiconductor substrate under the output gate, characterized in that the clock signal line connected to the transfer electrode immediately before the output gate is wired separately from the clock signal line through which the same clock signal is transferred to the other transfer electrodes.

When the clock signal is applied through an external clock signal input terminal, the separately wired clock signal lines are connected to the external clock signal input terminal via respective resistors which protect the transfer elements from electrostatic voltages. In more detail, the clock signal line connected to the final transfer electrode is connected between the clock signal input terminal and the final transfer electrodes via a first protective resistor and the other clock signal line for the same clock signal is connected from the same clock signal input terminal via a second protective resistor to a plurality of transfer electrodes. The electrical connection path between the first protective resistor and the clock signal input terminal may be in common, over its whole or partial length, with the electrical connection path between the second protective resistor and the clock signal input terminal.

When the clock signal applied to the final transfer electrode immediately before the output gate is applied from an independent input terminal different from the input terminal of the clock signals applied to the other transfer electrodes, a completely independent clock signal line may be provided from that input terminal to the final transfer electrode immediately before the output gate via the protective resistor.

Where the semiconductor device includes a clock signal generation means within the chip, the protective resistor or resistors are not necessary. In this case, therefore, the clock signal generation means and the transfer electrode of the final stage may be connected by a clock signal line having no contact with the other transfer electrodes. In this case, further, a clock signal generator may be provided specially for the final transfer electrode, which generates a clock signal which rises at the same time when the clock signal for the other transfer gates rises and which falls faster than the latter clock signal falls.

In accordance with the charge transfer device of the present invention, a clock pulse applied to the final transfer electrode immediately before the output gate is applied through a signal line provided independently of the signal line for the other transfer electrodes which receive the same or similar clock pulse, without being affected by those other transfer electrodes. Accordingly, the distortion of the clock pulse is reduced, and the speed of charge transfer from the gate of the final stage to the detection element is increased. The transferred charge can be held accurately within a predetermined holding time. Since the charge can be transferred to the detection element more quickly than in the conventional device, the control speed of the charge detection element can be increased. In other words, the maximum driving frequency of the device can be improved. Moreover, since the effective charge holding time can be increased, errors in the detection of the quantity of charge can be effectively prevented.

Still further objects and advantages of the present invention will be apparent from the following detailed description and claims and from the accompanying drawings illustrative of the invention wherein:

BRIEF DESCRIPTION OF THE DRAWINGS

FIG. 7 is a diagram showing the fall characteristics of the output signal applied to the transfer gate of the final stage.

DESCRIPTION OF THE PREFERRED EMBODIMENTS

Figure 1:
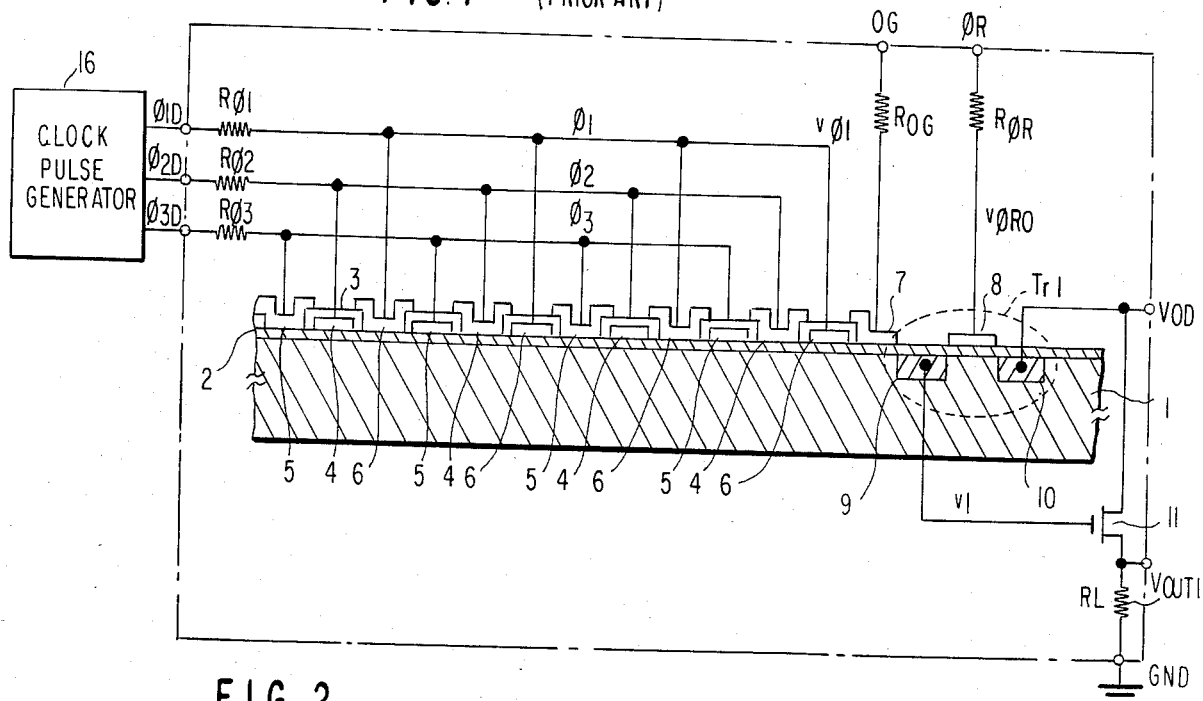
FIG. 1 shows a section of the principal parts of a conventional charge transfer device and the circuit for the control signals applied thereto and its output signal.

A conventional charge transfer device includes a plurality of charge transfer electrodes 4, 5 and 6 that are provided continuously along the surface of a semiconductor substrate 1 over an oxide film 2, as shown in FIG. 1. Clocks $\phi_1$, $\phi_2$, $\phi_3$ having mutually different phases are applied as control signals to the corresponding electrodes so that charge is transferred through charge transfer channels formed below each of the charge transfer electrodes 4, 5 and 6. The charge is transferred to a charge detection diffusion layer 9 (the source region of an MOS FET in this case) via an output gate 7, and then to the gate of an output MOS transistor 11. As a result, the voltage obtained across a load resistor 12 connected to the MOS transistor 11 is taken out as the output voltage of the transferred charge.

In any state other than the output operation, the charge in the source region (diffusion layer 9) is transferred to the drain diffusion region 10 by a reset pulse $\phi_R$ applied to the gate 8 and is lost therein. For ease of explanation, the following description deals with a surface channel type of charge coupled device in which the substrate is a p-type semiconductor and the carriers being transferred are electrons, by way of example. The clocks are generated by an external clock generator 16 and are applied via the clock input terminals $\phi_{1D}$, $\phi_{2D}$ and $\phi_{3D}$.

Figure 2:
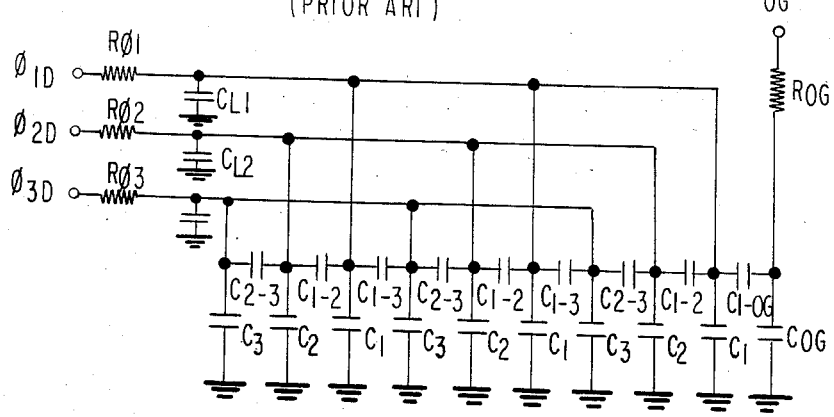
FIG. 2 is an equivalent circuit diagram of the part from the clock supply terminals to the transfer gate of the conventional device.

The equivalent circuit diagram viewed from the generator 16 of the charge transfer device shown in FIG. 1 is as shown in FIG. 2. Symbols $C_1$, $C_2$ and $C_3$ represent the capacitances between the respective charge transfer electrodes and substrate, and symbols $C_{1-2}$, $C_{2-3}$, $C_{1-3}$ represent the capacitances between adjacent two charge transfer electrodes. Symbols $C_{L1}$, $C_{L2}$ and $C_{L3}$ represent the wiring capacitances of the respective clock lines.

Symbols $R_{\phi 1}$, $R_{\phi 2}$, $R_{\phi 3}$ represent resistors that are inserted to protect the gate oxide films of the respective transfer electrodes 4, 5 and 6 and the insulation films between these electrodes from electrostatic breakdown.

Figure 5:
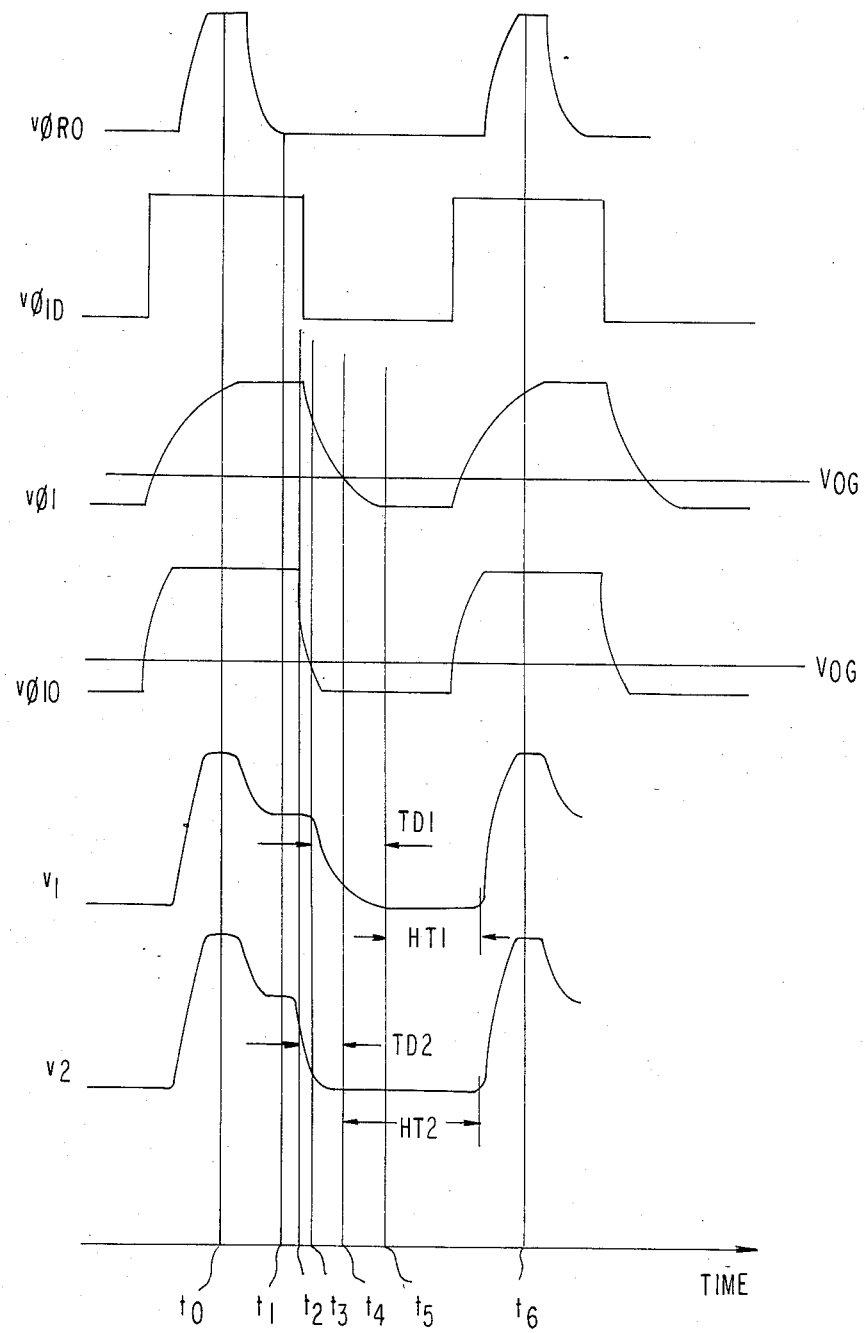
FIG. 5 is a waveform chart showing the waveform of each clock pulse, the control signal of the charge detection element, and the output signal.

Because of the capacitances $C_1$ through $C_3$, $C_{1-2}$ through $C_{1-3}$ and $C_{L1}$ through $C_{L3}$ and the resistances $R_{\phi 1}$ through $R_{\phi 3}$, however, the maximum driving frequency of the charge transfer device is limited for the reasons given below, and hence a high speed performance of the device cannot be obtained. Even if a square wave as a clock pulse is inputted through terminal $\phi_{1D}$, the voltage $v_{\phi 1}$ actually inputted to gate $\phi_1$ is distorted as shown in FIG. 5. The waveform distortion of this voltage $v_{\phi 1}$ applied to gate $\phi_1$ reduces the rate of change of the potential well below this gate $\phi_1$ and increases the time required for one charge transfer. This increase in turn reduces the speed at the output stage.

As shown in the timing chart of FIG. 5, assume that a high level input $V_{\phi R0}$ is applied at time $t_0$ to terminal $\phi_R$ (FIG. 1) to make the charge detection MOS transistor Tr1 conductive, and to make the source potential $V_1$ of the MOS transistor Tr1 equal to its drain potential $V_{0D}$. That is, the MOS transistor is reset. At time $t_1$, a voltage of terminal $\phi_R$ goes low level to place the diffusion layer 9 as the source of the MOS transistor Tr1 at a floating potential. As time passes from this state to times $t_2$, $t_3$ and $t_4$, the potential well below the gate of the electrode 6' (that is, the transfer electrode of the final stage) becomes shallower and the carriers stored in this potential well are induced to flow into the source diffusion layer 9 of the MOS transistor Tr1 through the channel below the output gate electrode 7 to which a predetermined voltage $V_{0G}$ is applied. The potential change of the source diffusion layer 9 caused by the flowing carriers is applied to a source follower circuit consisting of the MOS transistor 11 and the resistor 12 so that an output signal can be taken out from $V_{out}$ terminal. This sequence is shown in FIG. 6(a).

As can be seen in the above explanation of the output circuit operation, a drop in the rate of change of the clock pulse at gate $\phi_1$ of the final stage causes a drop in the rate of change of the potential well below that gate. This in turn results in an increase of the time required for the charge to flow into the diffusion layer 9. In other words, the delay time (TD1) in FIG. 5 increases. Assuming that the period of the gate control pulse $\phi_R$ of the detection element is constant, an increase in the delay time (TD1) will reduce the signal voltage holding time (HT1) substantially. For this reason, if the driving frequency of the charge transfer device is increased in the condition that the high level period of $\phi_R$ is constant, the next pulse $\phi_R$ is undesirably occurred before the TD1 period is completed. This is the same as resetting the potential of the diffusion layer 9 before the charge has been completely transferred to the diffusion layer 9. Hence, the correct signal output does not appear at the $V_{out}$ terminal. Here, the timing at which HT1 becomes zero due to the increase of TD1 represents the maximum driving frequency of this charge transfer device.

It can be understood from the above description that in order to increase the maximum driving frequency, the rate of change of the potential of the charge transfer electrode immediately before the output gate must be increased. As described already, however, this speed cannot be increased because of the presence of the capacitors $C_1$ through $C_3$, $C_{1-2}$ through $C_{1-3}$ and $C_{L1}$ through $C_{L3}$, and the resistors $R_{\phi 1}$ through $R_{\phi 3}$. If the values of $R_{\phi 1}$ through $R_{\phi 3}$ were reduced in order to improve the speed, the electrostatic proof voltage would decrease undesirably. On the other hand, if the capacitances were reduced, the quantity of charge that could be transferred would drop and this is not desirable, either.

As explained in detail, an increase in the value of the input protection resistors to improve the electrostatic proof voltage in the conventional charge transfer device results in a drop in the maximum driving frequency.

One embodiment of the present invention will now be described with reference to FIGS. 3(a) and 3(b), in which like reference numerals are used to identify similar constituents to those in FIG. 1. In this embodiment, a surface channel type charge coupled device with a clock pulse circuit and an output circuit is formed on a single semi-conductor chip 20 using a p-type semiconductor substrate 1, and a clock pulse generator 16 is provided separately from the chip. The chip 20 has a lot of external terminals including these $\phi_{1D}$, $\phi_{2D}$, and $\phi_{3D}$ for clock pulses. The oxide film 2 is provided over the substrate surface and three groups of transfer gate electrodes (e.g. polysilicon electrodes) 4, 5 and 6 are formed thereon in series. All the electrodes are electrically isolated from one another by the oxide film 3. First group electrodes 6 except a final stage electrode 6" are in contact with a first wiring layer $B_1$ which is coupled to a first clock supply terminal $\phi_{1D}$ via the protective resistor $R_{\phi 1}$. Each of second group electrodes 4 is in contact with a second wiring layer $B_2$ which is coupled to a second clock supply terminal $\phi_{2D}$ via the protective resistor $R_{\phi 2}$. Each of third group electrodes 5 is in contact with a third wiring layer $B_3$ which is coupled to a third clock supply terminal $\phi_{3D}$ via the protective resistor $R_{\phi 3}$. The electrode 6" of the final stage is connected to a fourth wiring layer $B_{10}$ which is coupled to the first clock supply terminal $\phi_{1D}$ via another protective resistor $R_{\phi 10}$. The clock pulses $\phi_1$, $\phi_2$, $\phi_3$ having mutually different phases are applied to the terminals $\phi_{1D}$, $\phi_{2D}$, $\phi_{3D}$ from the external generator 16. The clock pulse applied to the electrode 6" is referred to as $\phi_{10}$. The output gate 7 adjacent to the electrode 6" of the final stage is connected to a terminal 0G by a wiring 18 via a protective resistor $R_{0G}$ and this terminal 0G is at a predetermined and fixed potential $V_{0G}$.

The charge detection element is disposed adjacent to the output gate 7. This element has source and drain diffusion layers 9 and 10 into which n-type impurities have been introduced and a gate electrode 8 is provided between them. A control voltage $V_{\phi R0}$ is applied to the gate electrode 8 through a wiring 19 from terminal $\phi R$ via the protective resistor $R_{\phi R}$. A MOS transistor 11 is provided in the output stage, the drain of this transistor is coupled to the drain region of the detection element and to the power terminal ($V_{0D}$), and its gate is coupled to the source region 9 of the detection element so as to generate an output potential according to the quantity of charge inputted to this source region 9 across the load resistor 12 between the source and ground. This output terminal is taken out through an output terminal $V_{out2}$.

The fourth wiring $B_{10}$ of the transfer electrode 6" immediately before the output electrode 7 is physically isolated from the first wiring $B_1$ through which the clock pulse of the same phase $\phi_1$ is transferred. The input protective resistors $R_{\phi 10}$ and $R_{\phi 1}$ have values different from each other. This arrangement makes the rate of change of the voltage of electrode 6" higher than those of the other $\phi_1$ electrodes.

Figure 4:
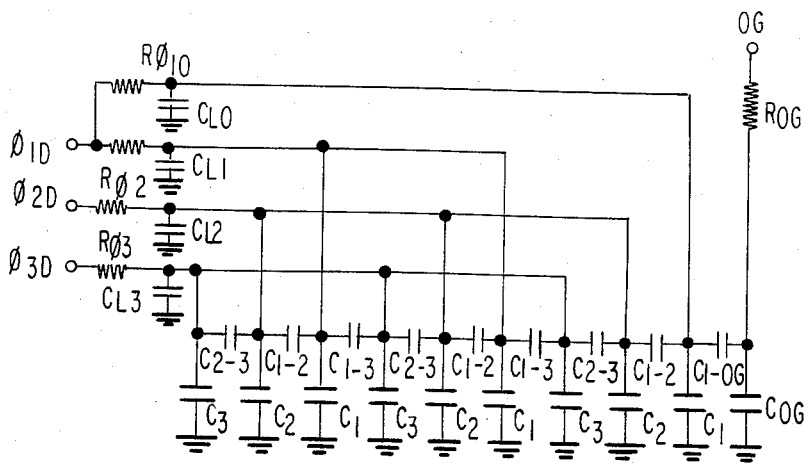
FIG. 4 is an equivalent circuit diagram of the part from the clock supply terminals to the transfer gate in the charge transfer device of FIG. 3.

As can be seen from the equivalent circuit shown in FIG. 4, the time constant $\tau_{10}$ of pulse $\phi_{10}$ applied from terminal $\phi_{1D}$ to electrode 6" is given by the following equation:

$$\tau_{10} = R_{\phi 10} \times (C_{1-2} + C_1 + C_{1-0G} + C_{L0}) \quad (1)$$

On the other hand, the time constant $\tau_1$ of pulse $\phi_1$ applied from terminal $\phi_{1D}$ to the other electrodes 6 is given by the following equation:

$$\tau_1 = R_{\phi 1} \times [(C_{1-2} + C_1 + C_{1-3}) \times N + C_{L1}] \quad (2)$$

and $\tau_1$ is greater than $\tau_{10}$. N is the number of transfer stages of the charge transfer device.

For example, if $R_{\phi 10} = 1$ K ohm,
$R_{\phi 1} = 100$ ohm,
$C_1 = 0.5$ pF, $C_{1-2} = C_{1-3} = C_{1-0G} = 0.05$ pF,
$C_{L0} = 10$ pF,
$CL_1 = 10$ pF,
$N = 1,000$, equations (1) and (2) give:

$$\tau_{10} = 1 \times 10^3 \times 10.6 \times 10^{-12} = 10 \text{ (nsec)}$$

$$\tau_1 = 100 \times 610.00 \times 10^{-12} \text{ (nsec)}$$

In other words, the time constants differ by a factor of approximately six. It has been proved experimentally that if the input protective resistor is at least 1 K ohm, the electrostatic breakdown of electrode 6″ can be sufficiently prevented.

From the foregoing, the rate of change of the voltage of the transfer electrode immediately before the output electrode can be improved without reducing the electrostatic proof voltage by independently wiring only the transfer electrode immediately before the output electrode. Accordingly, the injection speed of the transferred charge into the diffusion layer 9 can be improved and the maximum driving frequency of the charge transfer device can thus be improved.

This will be further explained with reference to FIG. 5. When a clock pulse $V_{\phi 1D}$ is applied to the clock supply terminal $\phi_{1D}$, a clock pulse $V_{\phi 10}$ is applied to electrode 6″ of the final stage. Since this pulse $V_{\phi 10}$ is not affected by the transfer electrodes 6, its rise and fall are quicker than those of the pulse $V_{\phi 1}$. Accordingly, the transfer speed of the charge injected into the source region 9 of the detection element through the output stage gate also becomes faster and the delay time $TD_2$ is markedly reduced over the conventional delay time $TD_1$. The output voltage detected by the MOS transistor 11 of the output stage becomes that $V_2$ and the effective holding time $HT_2$ in the source region 9 of the detection element becomes longer than that of the conventional device. In other words, the frequency of the control signal input to the gate 8 of the detection element can be increased by as much, and hence the maximum operating frequency of the device can be increased. Needless to say, any errors in which the quantity of the charge is detected before the charge transfer via the output gate is complete can be prevented because the effective holding time $HT_2$ is longer.

Figure 6:
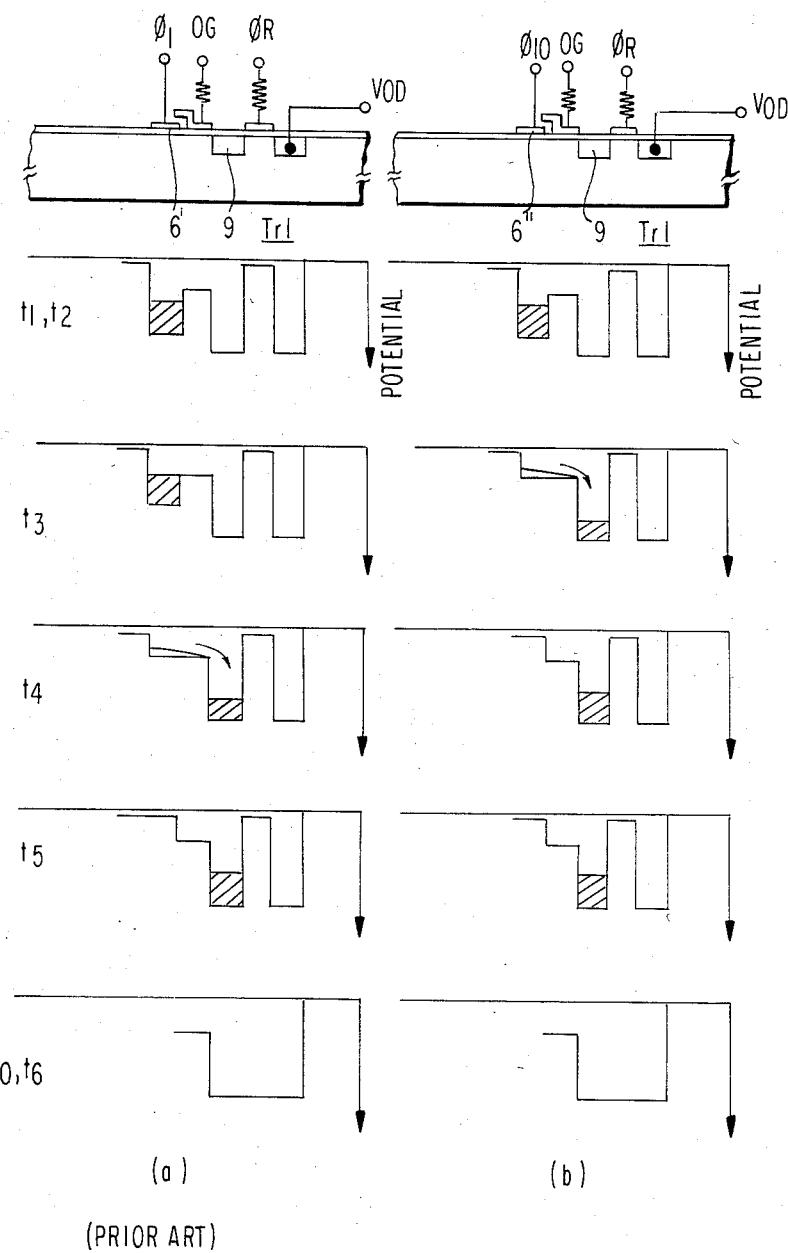
FIG. 6(a and b) is a diagram showing the timing of the transfer of charge from the transfer gate of the final stage to the charge detection element.

This operation will be explained in detail with reference to FIG. 6. FIG. 6(b) is the timing chart of the charge transfer in this embodiment. The diagrams show the transfer of the potential well into the source region 9 of the detection element from the electrode 6″ of the final stage. Since there is less distortion of the clock pulse $\phi_{10}$ applied to electrode 6″ of the final stage in this embodiment, a transfer of charge is already occuring at time $t_3$ through the output gate 7. At time $t_4$, all the transferred charge has been injected into the source region 9 of the detection element. Accordingly, the charge holding time between times $t_4$ and $t_5$ is longer than that in the conventional device. As a result, the detection of the quantity of charge can be accurately made even if a reset pulse is applied to the gate 8 of the detection element.

FIGS. 7(a) through 7(c) show the fall characteristics of the output signal of the transferred charge applied to the region of the electrode 6″ final stage. The characteristics shown in the diagrams are the output signal waveforms when the voltage $V_{0G}$ applied to the output gate is changed. FIGS. 7(a) and 7(b) show the characteristics of the conventional device. The distortion of the clock $\phi_1$ at the final stage electrode in the conventional device (6′ in FIG. 1) has a delay time of at least 900 ns when $V_{0G} = 1.75$ V. As the gate voltage is gradually increased, the delay time becomes shorter but when the limit of 7 V is applied to the gate electrode, the delay time is still 60 ns. In other words, a delay of 60 ns is unavoidable in the conventional device even if the gate voltage is made a maximum.

In contrast, in the charge transfer device of this embodiment of the present invention, the delay time is 60 ns when the gate voltage is 2 V, as shown in FIG. 7(c), and when this gate voltage is increased to 4 V, the delay time becomes as little as 20 ns. In other words, the delay time can be reduced to 1/7 or less of that of the conventional device. Incidentally, the delay time does not vary much from the value of 20 ns even when the gate voltage $V_{0G}$ is increased above 4 V.

Figure 8:
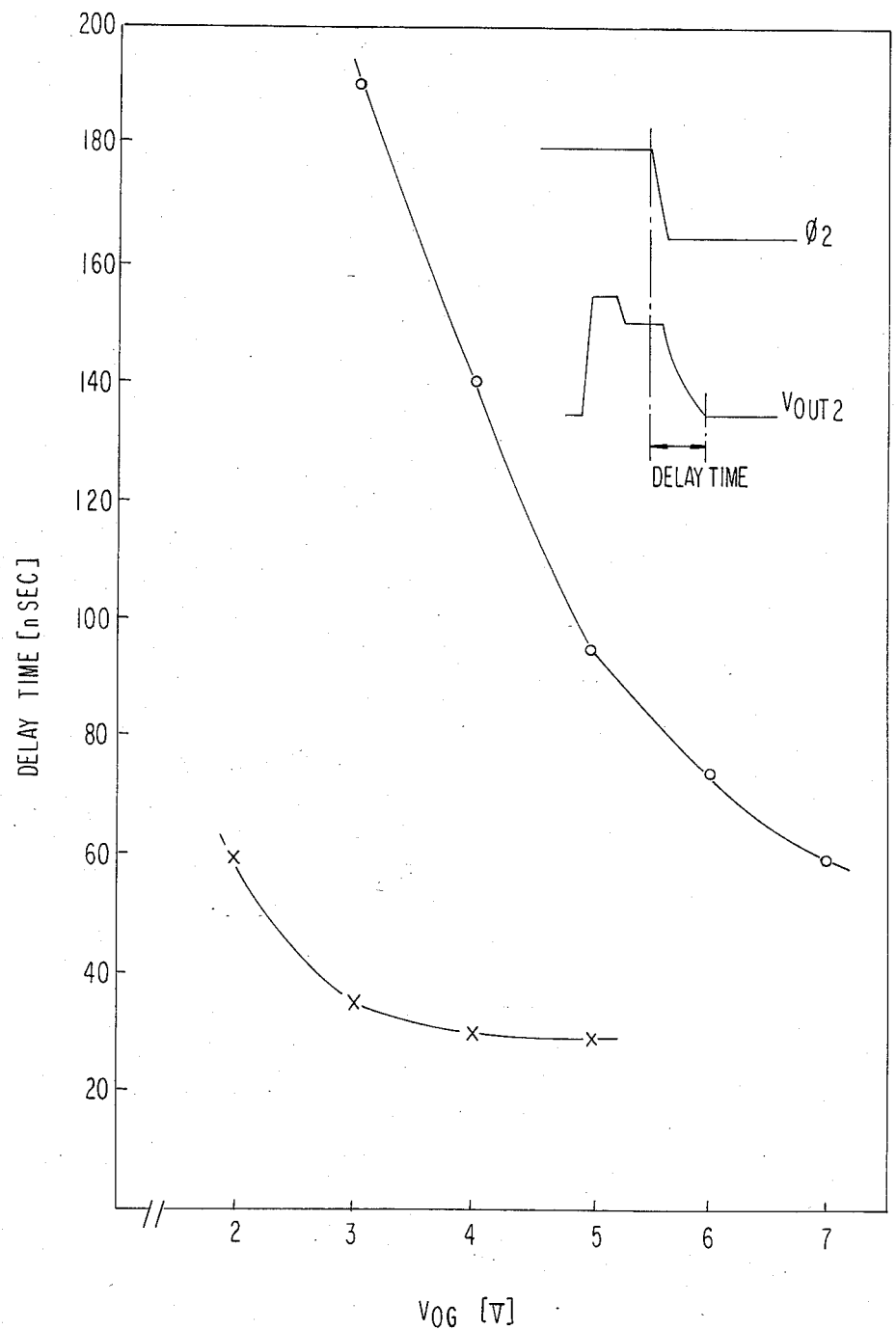
FIG. 8 is a graph showing the characteristics of the delay time of the charge being transferred against the gate voltage of the output gate.

The difference between the prior art and the present invention can be seen more clearly in FIG. 8. The graph shows the delay time of the output voltage due to the distortion of the clock pulse using the gate voltage $V_{0G}$ as the function. The line connecting the circles represents the prior art, and the line connecting the X's represents the present invention.

As described above, the delay of the signal being transferred can be markedly reduced by separating the clock line connected to the electrode of the final stage from that connected to the other electrodes, and the device can be controlled at a high speed. The prior art control signal ($\phi_R$) of the present invention can be increased to approximately 10 MHz. Namely, the clock pulse may be 10 MHz.

Though the foregoing explanation of the invention deals with a surface channel type of charge coupled device (CCD), the present invention can be naturally applied to other CCDs in which part or the entire area of which has a varied channel, and also to BBDs. The conductivity of the semi-conductor substrate is not limited to p-type, but n-type substrates can also be used by inverting the conductivity type as well as the polarity of the potential.

Figure 3A:
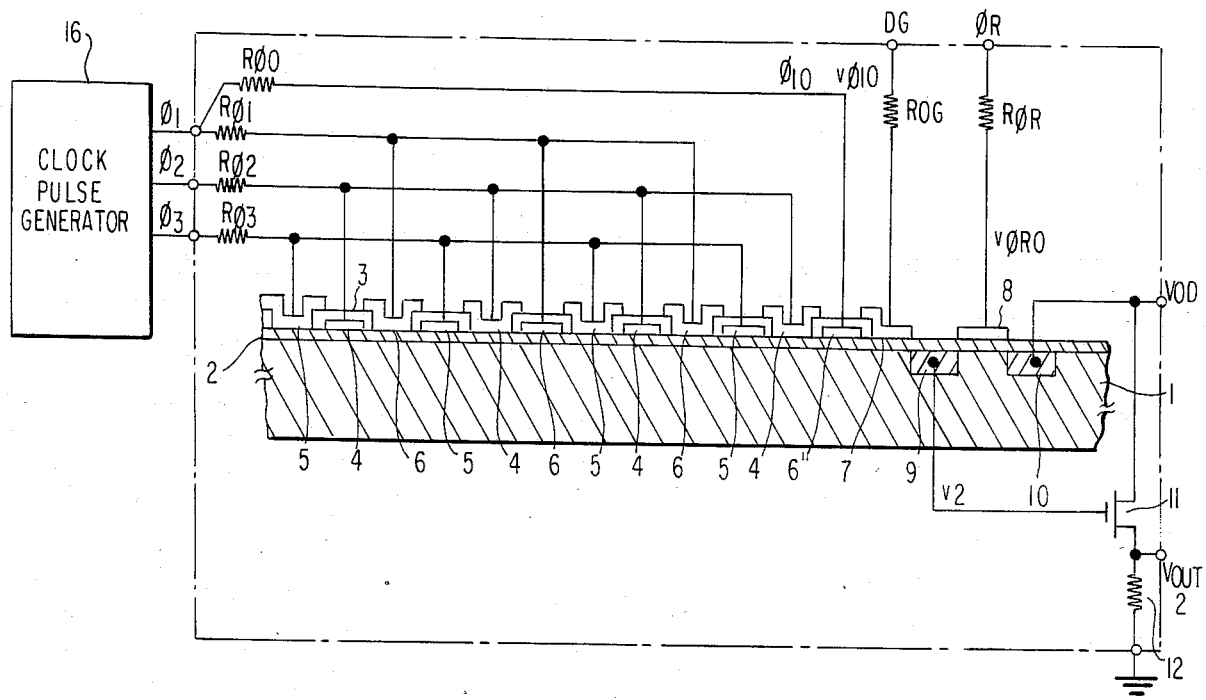
FIG. 3(a) shows a cross-section of a principal part of the charge transfer device in accordance with one embodiment of the present invention, and the circuit for the control signals applied thereto and its output signals.
Figure 3B:
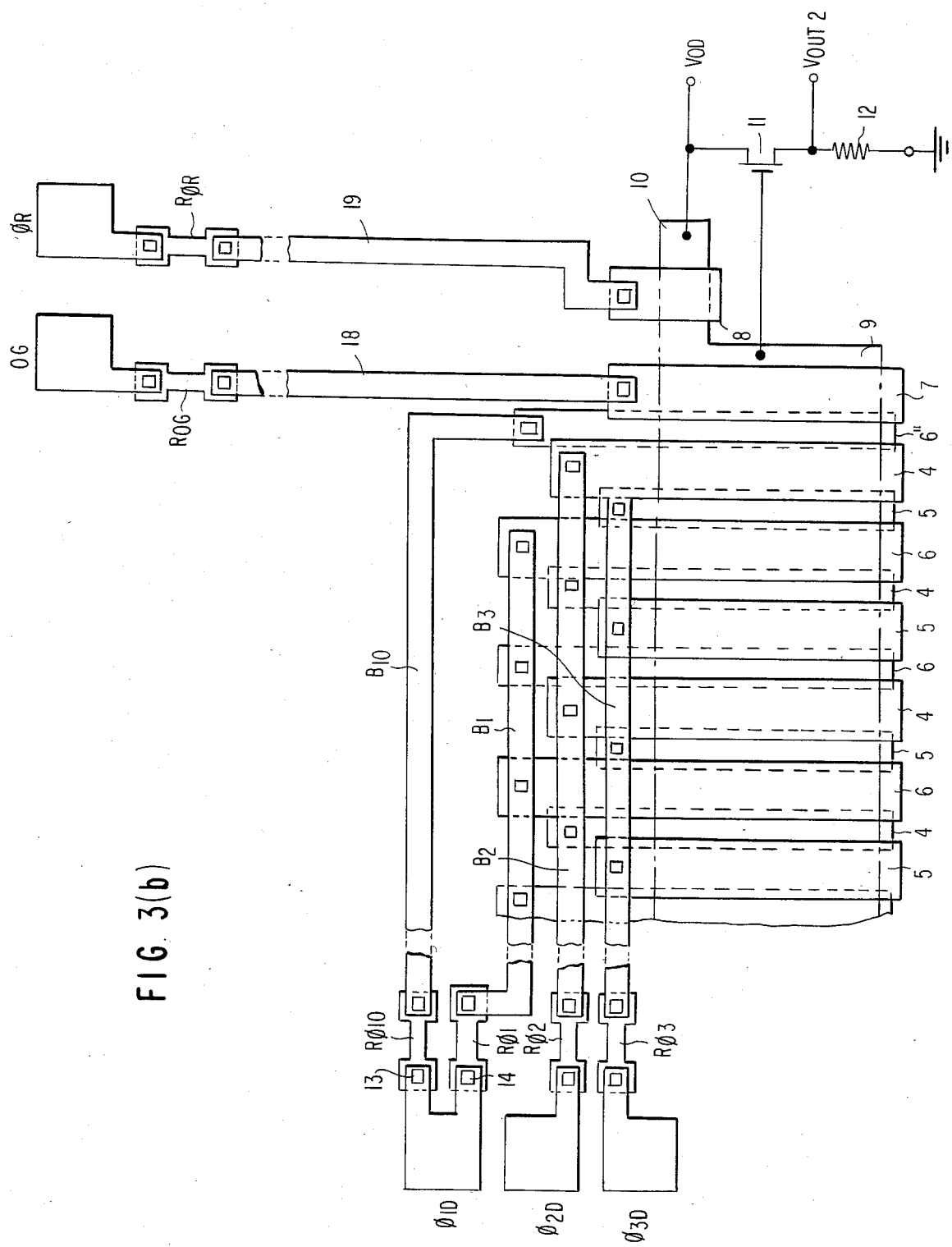
FIG. 3(b) shows a plan view of the principal part of the charge transfer device shown in FIG. 3(a) and the wiring structure for the control signals applied thereto, with a circuit for the output signals.

In the above-described embodiment shown in FIGS. 3(a) and 3(b), one end of the fourth wiring layer $B_{10}$ as a clock signal line extending from one end 13 of the resistor $R_{\phi 10}$ is connected to the first terminal $\phi_{1D}$. However, this end may be connected to a portion of the first wiring layer $B_1$ between the terminal $\phi_{1D}$ and one end 14 of the resistor $R_{\phi 1}$, or may be directly connected to the one end 14 of the resistor $R_{\phi 1}$. Furthermore, the chip 20 may have an independent clock terminal to which the one end of the fourth wiring layer $B_{10}$ is solely connected, for receiving the same clock pulse $\phi_1$ as that received by the terminal $\phi_{1D}$.

Figure 9:
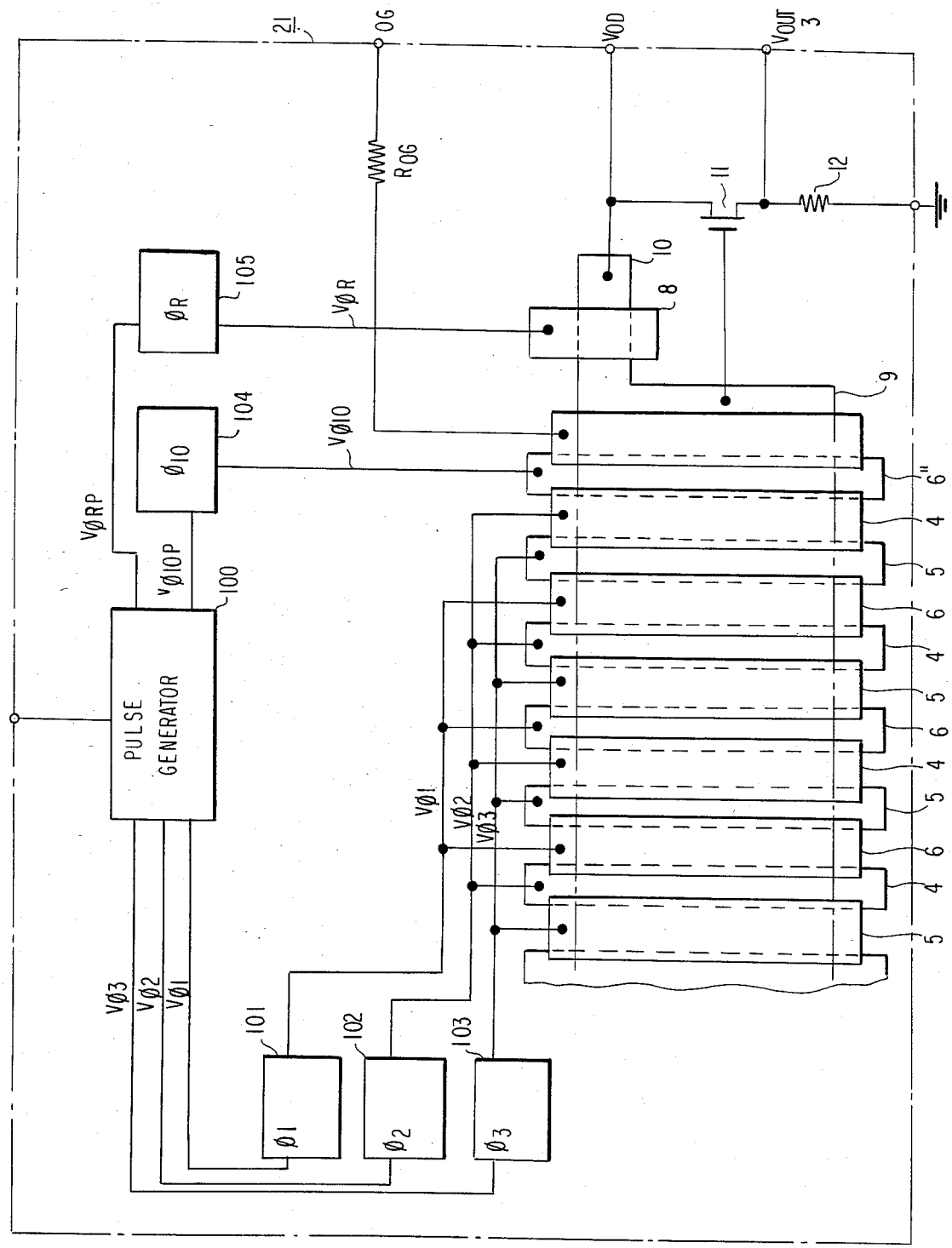
FIG. 9 shows another embodiment of the present invention, including a plan view of a principal part of the charge transfer device and a circuit diagram for the control signals and output signals.
Figure 10:
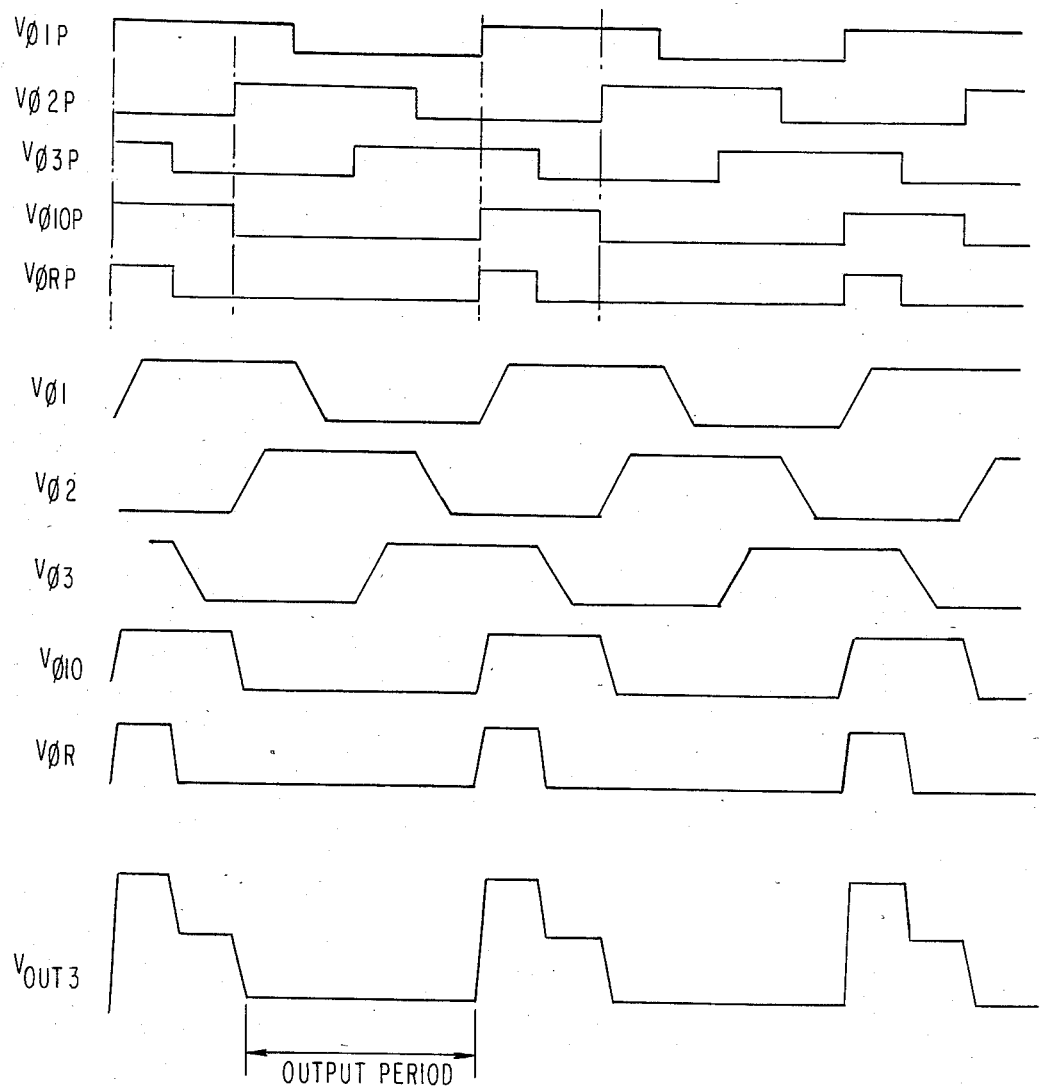
FIG. 10 shows a timing chart of FIG. 9.

FIG. 9 shows another embodiment of the present invention in which a pulse generator circuit 100 and clock driver circuits 101 to 105 are formed integratedly on a semiconductor chip 21 of the change transfer device shown in FIG. 3. The pulse generator circuit 100 generates clock pulses $V_{\phi 1P}$, $V_{\phi 2P}$, $V_{\phi 3P}$, $V_{\phi 10P}$ and $V_{\phi RP}$ which are inputted to the corresponding clock driver circuits 101 to 105, which in turn output clock signals $V_{\phi 1}$, $V_{\phi 2}$, $V_{\phi 3}$, $V_{\phi 10}$ and $V_{\phi R}$. In this embodiment, the clock driver 104 is independently provided on the chip to generate a clock signal $V_{\phi 10}$ solely for the final gate 6″. Further, when the pulse generator circuit 100 generates clock pulses $V_{\phi 1P}$ to $V_{\phi RP}$ as shown in FIG. 10, and each driver circuit 101 to 105 generates clock signals $V_{\phi 1}$ to $V_{\phi R}$ in response to the clock pulses, an output wave form at the output terminal $V_{out}$ 3 becomes very sharp in its fall characteristics as shown in FIG. 10. The clock pulse $V_{\phi 10P}$ rises to became a high level at the same time when the clock pulse $V_{\phi1P}$ rises and falls down to a low level faster than $V_{\phi1P}$ falls and at the same time as the clock pulse $V_{\phi2P}$ falls. With such clock pulse $V_{\phi10P}$, a holding time of the output signal becomes very long. If an independent clock terminal is provided for the final stage electrode 6″ at the chip 20 of the embodiment shown in FIGS. 3(a) and 3(b), the above-mentioned clock pulse $V_{\phi10P}$ may be applied to that independent clock terminal while the clock input terminal $\phi_{1D}$ receives the above-mentioned clock pulse $V_{\phi1P}$.

What is claimed is:

1. A charge transfer device on a semiconductor substrate comprising:
   a plurality of input terminals receiving clock pulses;
   a plurality of first resistors each connected with a corresponding one of said input terminals;
   a plurality of first signal lines each connected with a corresponding one of said first resistors;
   a plural set of transfer gates disposed in a line such that a predetermined order of said sets is repeated, said transfer gates in each of said sets, except for a final stage transfer gate, being connected with corresponding ones of said first signal lines to receive corresponding ones of said clock pulses;
   a second resistor having one end connected with one of said input terminals;
   a second signal line inserted between the other end of said second resistor said said final stage transfer gate, said second signal line being physically separated from said first signal lines; and
   a detection means disposed adjacent to said final stage transfer gate for producing an output signal in response to charges transferred thereinto from a region of said semiconductor substrate under said final stage transfer gate.

2. The charge transfer device as claimed in claim 1, wherein said detection means includes an output gate receiving a constant voltage potential and disposed adjacent to said final stage transfer gate, a semiconductor region disposed adjacent to said output gate and having a conductivity type opposite to said semiconductor substrate and a charge-voltage converter for converting said charges transferred into said semiconductor region to a voltage as said output signal.

3. The charge transfer device as claimed in claim 2, wherein the respective numbers of said input terminals, said first resistors and said first signal lines are three so that first, second and third input terminals are respectively connected with first, second and third ones of said first signal lines through first, second and third ones of said first resistors, said clock pulses being first, second and third pulse signals having different phases.

4. The charge transfer device as claimed in claim 3, wherein said transfer gates connected to said first, second and third ones of said first signal lines are repeatedly disposed in the order of first, second and third so that said transfer gates including said final stage transfer gate repeatedly receive said first, second and third pulse signals in this order.

5. A charge transfer device formed on a semiconductor substrate comprising:
   first, second and third input terminals receiving first, second and third clock pulses, said first, second and third clock pulses having different phases so that said first, second and third pulses are generated in the order, first, second and third, respectively;
   first, second and third resistors having one end connected with said first, second and third input terminals, respectively;
   first, second and third signal lines connected with the other ends of said first, second and third resistors, respectively;
   a plurality of transfer gates arranged in a line, said transfer gates, except for a final stage transfer gate, being connected with said first, second and third signal lines, respectively, so that said transfer gates connected with said first, second and third signal lines are repeatedly disposed in this order;
   a fourth signal line connected with said final stage transfer gate;
   a fourth resistor inserted between said fourth signal line and a predetermined one of said first, second and third input terminals so that the line of said transfer gates including said final stage transfer gate repeatedly receives said first, second and third clock pulses in this order;
   an output gate disposed adjacent to said final stage transfer gate, said output gate receiving a constant voltage; and
   a detection means for producing a output signal in response to charges transferred thereinto from a region of said semiconductor substrate under said output gate.

6. The charge transfer device as claimed in claim 5, wherein said detection means includes a semiconductor region having a conductivity type opposite to said semiconductor substrate, said semiconductor region being disposed adjacent to said output gate, and a charge-voltage converter for converting said charges transferred into said detection means to a voltage as said output signal.

7. The charge transfer device as claimed in claim 6, wherein said charge transfer device further comprises a power voltage terminal and a reference terminal, said charge-voltage converter including an insulated gate field effect transistor having a gate electrode connected with said semiconductor region, a drain electrode connected with said power terminal and a source electrode, a fifth resistor inserted between said source electrode and a reference terminal and an output terminal connected with said source electrode.

8. A charge transfer device on a semiconductor substrate comprising;
   a pulse generator generating a plurality of first clock pulses, said first clock pulses having different phases with one another, said pulse generator further generating a second clock pulse having the same phase as one of said first clock pulses;
   a plurality of first signal lines each receiving a corresponding one of said first clock pulses, respectively;
   a second signal line receiving said second clock pulse;
   plural sets of transfer gates arrayed in a line, said transfer gates belonging to different sets being disposed side by side in predetermined order such that said predetermined order of said sets is repeated, said transfer gates belonging to the same sets except for a final stage transfer gate and being connected with a corresponding one of said first signal lines, respectively, so that said transfer gates repeatedly receive said first clock pulses in a predetermined order of said first clock pulses, said final stage transfer gate being connected to said second signal line; and a detection means disposed adjacent to said final stage transfer gate for producing an output signal.

9. The charge transfer device as claimed in claim 8, wherein said detection means includes an output gate receiving a constant voltage potential and disposed adjacent to said final stage transfer gate, a semiconductor region disposed adjacent to said output gate and having a conductivity type opposite to said semiconductor substrate and a charge-voltage converter for converting said charges transferred into said semiconductor region to a voltage as said output signal.

10. The charge transfer device as claimed in claim 9, wherein said pulse generator generates first, second and third clock pulses having different phases with one another and producing pulse signals in the order of first, second and third, the numbers of said first signal lines and sets of transfer gates being respectively three so that transfer gates belonging to first, second and third sets respectively receive said first, second and third clock pulses through said first, second and third signal lines.

11. A system for operating a charge transfer device comprising:

a pulse generator generating first, second and third clock pulses having phases different from one another and a fourth clock pulse, said phase of said first clock pulse being advanced relative to said second and third clock pulses, said phase of said third clock pulse being late relative to said first and second clock pulses, and said fourth clock pulse having a leading edge synchronized with a leading edge of said first clock pulse and a falling edge synchronized with a leading edge of said second clock pulse;

a charge transfer device having a plurality of transfer gates arrayed in a line and an output detection means for producing an output signal from charges transferred from a final stage transfer gate;

a first means for applying said first clock pulse to every third transfer gate, except for said final stage transfer gate;

a second means for applying said second clock pulse to every third transfer gate, except for said final stage transfer gate, starting with a transfer gate located next to a said transfer gate to which said first clock pulse is applied;

a third means for applying said third clock pulse to every third transfer gate, except for said final stage transfer gate starting with a transfer gate located between a said transfer gate to which said second clock pulse is applied and a said transfer gate to which said first clock pulse is applied; and a fourth means for applying said fourth clock pulse to said final stage transfer gate.

12. The system for operating a charge transfer device as claimed in claim 11, wherein said output detection means includes an output gate located adjacent to said final stage transfer gate and receiving a constant voltage, and a charge-voltage converter for converting charges transferred from said final stage transfer electrode to a voltage signal as said output signal.

* * * * *